United States Patent
Bony et al.

[11] Patent Number: 5,892,652
[45] Date of Patent: Apr. 6, 1999

[54] SENSITIVE KEY DEVICE HAVING A DETECTIVE SURFACE IN DIRECT CONTACT WITH A PLATE

[75] Inventors: Jean-Michel Bony, Orleans; Fabrice Frappereau, Jean De La Ruelle; Kim Ly Kha, Recologne; Jean-Pierre Nugeyre, Clery St Andre, all of France

[73] Assignee: Compagnie Europeenne pour l'Equipement Menager-Cepem, St. Jean De La Ruelle, France

[21] Appl. No.: 770,720

[22] Filed: Dec. 19, 1996

[30] Foreign Application Priority Data

Dec. 19, 1995 [FR] France .................................. 95 15058

[51] Int. Cl.$^6$ .............................. H01G 5/18; H01G 5/06; H01H 1/24
[52] U.S. Cl. ................. 361/291; 361/298.2; 361/298.4; 200/246; 200/275
[58] Field of Search .......................... 200/238, 245–246, 200/275, 282–284, 290, 292, 530, 532, 534–535; 361/288, 290–291, 280–281, 283.1–283.3, 298.2, 298.4; 341/33–34; 400/479.1, 473, 495, 495.1

[56] References Cited

U.S. PATENT DOCUMENTS

| | | |
|---|---|---|
| 3,950,846 | 4/1976 | Johnson . |
| 4,056,699 | 11/1977 | Jordan . |
| 4,090,229 | 5/1978 | Cencel et al. . |
| 4,584,444 | 4/1986 | Nagashima . |
| 4,737,602 | 4/1988 | Yamamoto ............................. 200/292 |
| 4,952,762 | 8/1990 | Koyanagi ............................... 200/517 |
| 5,545,864 | 8/1996 | Bauer et al. ........................... 200/283 |

FOREIGN PATENT DOCUMENTS 2 704 332   10/1994   France .

*Primary Examiner*—Kristine Kincaid
*Assistant Examiner*—Anthony Dinkins
*Attorney, Agent, or Firm*—Oblon, Spivak, McClelland, Maier & Neustadt, P.C.

[57] ABSTRACT

This invention concerns a sensitive key device with capacitive effect working through an electrically insulating plate, the key being supported by a printed circuit board. According to the invention, the bottom of a single part having a spring blade made of an electrically conducting material is fixed to the printed circuit board. The top (11) of this part forms a detection surface designed to be placed in contact with the transparent plate. The center of the part makes the part flexible such that the detection surface is in elastic contact with the plate, regardless of parallelism defects between this plate and the printed circuit board.

8 Claims, 1 Drawing Sheet

SENSITIVE KEY DEVICE HAVING A DETECTIVE SURFACE IN DIRECT CONTACT WITH A PLATE

BACKGROUND OF THE INVENTION

This invention concerns sensitive key devices with capacitive effect used particularly in numeric keypads, for example for a kitchen hob.

It is known that this type of device is capable of detecting the presence of an element (a user's finger or an electrically conducting object such as a metal saucepan) through an electrically insulating body like a glass or vitroceramic plate.

More precisely, placing a finger or an object on a plate in an area opposite a sensitive key will cause a change in capacitance. The key is electrically connected to an electronic circuit that detects this change in capacitance and transforms it into an active or inactive state.

Many embodiments of keys that operate based on the above principle have already been suggested. These solutions are particularly concerned with specific embodiments in which the key and components forming the electronic key activation detection circuit are placed on an electrically insulating support located behind the plate.

In a first known embodiment, this electrically insulating support is composed of two printed circuit boards facing each other and maintained at a given spacing, one of the two boards mainly supporting the keys obtained by engraving, and the other supporting mainly the electronic components. In this embodiment, manufacturing costs are considerably increased by difficulties in forming the mechanical and electrical connections when the two plates are assembled. Furthermore, even a minor defect in the plane of the board supporting the keys which is applied in contact with the internal surface of the transparent plate will cause air gaps between some keys and the transparent plate. This results in unsatisfactory operation due to differences in the sensitivity between the keys making up the keypad, or sometimes complete insensitivity of some keys.

In order to overcome these disadvantages, a second known embodiment proposes an electrically insulating support composed of a single printed circuit board containing both keys and electronic components. Each key contains an electrically conducting head mechanically connected to the printed circuit board by a first device capable of moving transversally with respect to the printed circuit board under the action of a second device comprising an electrically conducting spring. This spring forms the electrical link between the top of the key and the electronic circuit, and transverses displacement of the first device so that the head is in contact with the transparent plate. This type of embodiment is described in document FR-A-2.704.332. It overcomes the air gap problems mentioned above, but the number of distinct parts necessary to make the key remains high. These parts must be manufactured independently of each other which increases the global manufacturing cost, and assembly of these parts remains complicated. Furthermore, there is a high risk of a defect in the electrical contacts.

SUMMARY OF THE INVENTION

The purpose of this invention is to propose a new sensitive key device with capacitive effect in which the key and its assembly with other parts of the device are considerably simplified.

More precisely, the purpose of this invention is a sensitive key device with capacitive effect to detect the presence of an element through an electrically insulating plate, the key being supported by a printed circuit board approximately parallel to the said plate and being electrically connected to an electronic detection circuit supported by the said printed circuit board, characterized in that the key is composed of a single part made by an electrically conducting spring blade, with a base fixed on the printed circuit board and connected through a central part to an approximately planar upper part forming a detection surface designed to be placed in contact with the lower surface of the plate, the central part making the part flexible so that the detection surface is elastically in contact with the lower surface of the plate regardless of parallelism faults between the plate and the printed circuit board.

With this invention, a single part can fulfill the three functions essential for information transmission, namely: the key function, using the detection surface adjacent to the location that the user touches with his finger or an object; the spring function to keep the detection surface in contact with the plate, regardless of the faults in this plate; and the electrical connection between the detection surface and the components supported by the printed circuit board.

In a preferred embodiment of the invention, the spring blade is folded in the shape of a Z. The bottom of the blade is approximately planar, and with the upper part forms the two extreme legs of the Z, the central part forming the slanting part of the Z.

BRIEF DESCRIPTION OF THE DRAWINGS

Other advantages will become obvious by reference to the following detailed description when considered in connection with the accompanying drawings, wherein.

DESCRIPTION OF THE PREFERRED EMBODIMENT

Figure 1:
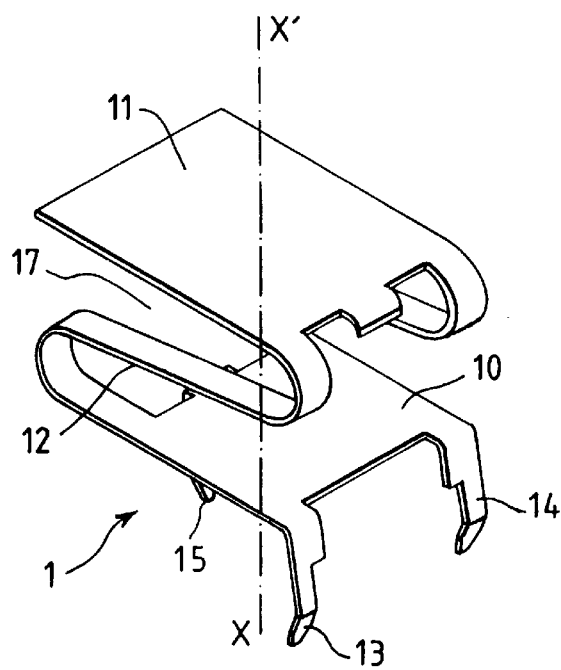
FIGS. 1 and 2 are perspective views from the top and bottom respectively, of a single part forming the key according to the invention.
Figure 2:
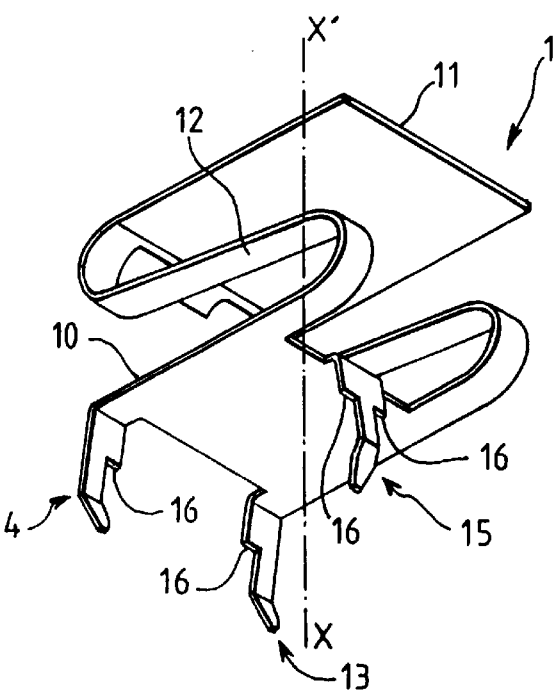
Figure 3:
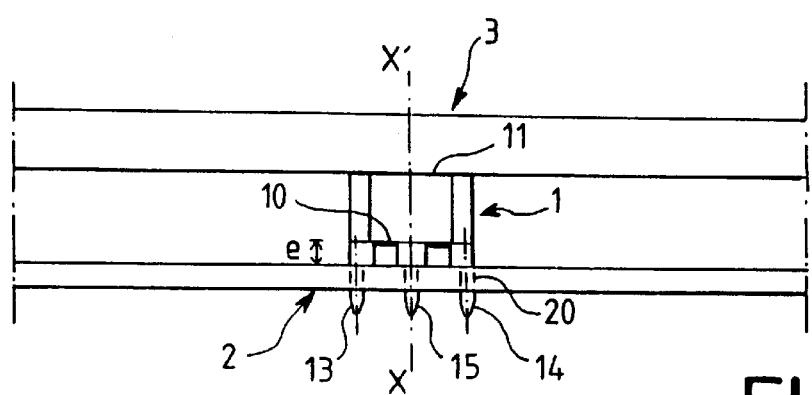
FIG. 3 is an elevation section showing the position of the key on the printed circuit board and under the plate.

As shown in the figures, the single part forming the key according to the invention and referred to as reference numeral 1 comprises a spring blade made of an electrically conducting material folded in the shape of a Z, and includes a base 10, an upper part 11 and a slanting part 12 forming the central part, and connecting base 10 and upper part 11. Base 10 and the upper part 11 are approximately planar and slanting part 12 is such that it makes the part flexible, particularly along the XX' axis.

Part 1 is fixed to the printed circuit board 2 at its base 10, for example with three pins 13, 14 and 15 forming an extension to the base and approximately perpendicular to it, that fit into three corresponding holes 20 in the printed circuit board 2. Some or all of the pins 13, 14 and 15 can be soldered or brazed directly onto a conducting track connected to the electronic detection circuit (not shown). Thus the pins provide mechanical support for part 1, and its electrical connection with the electronic detection circuit installed on the board.

It is advantageous to have three pins, for example the first two pins 13 and 14 being placed at the far end of base 10, with the third pin 15 at the opposite end of the base and approximately equidistant from the first two pins.

Preferably, each pin comprises a shoulder 16 that comes into contact with the upper surface of the printed circuit board 2. In this way, a spacing e is maintained between base 10 and board 2. Consequently, electronic components may be installed on the board 2 and under the base. This spacing may also help to facilitate washing of plate 2 if necessary after electronic components and part 1 have been soldered on plate 2.

When board 2 supporting part 1 is placed under plate 3 made of an electrically insulating and preferably transparent material, the upper part 11 is kept in contact with the lower surface of plate 3. This upper part 11 directly forms the detection surface, that the user can touch with his finger or with an object. The slanting part 12 makes part 1 flexible so that this detection surface is elastically in contact with the lower surface of the plate 3, regardless of parallelism faults between plate 3 and printed circuit board 2.

The slanting part 12 preferably comprises a central recess 17 along its entire length. Thus the flexibility of spring blade 1 is adjusted so that it does not apply an excessive force on the transparent plate 3 and on board 2. Apart from adjusting the spring blade force, the recess keeps the upper surface 11 planar when the part is compressed due to its stiffness, which is higher than the stiffness of the slanting part.

The material used to make the single part must be electrically conducting and elastic, and it must be possible to solder it. For example, copper or a copper alloy may be used.

The design of the key according to the invention has the following advantages: a single part containing all functions necessary for operation of the key minimizes manufacturing costs; assembly of the single part on a printed circuit board making use of a standard industrial process that includes insertion of the pins in the holes in the board and soldering of these pins; making connections by direct soldering simplifies and makes the connection more reliable; this key will work even in the presence of parallelism faults between the printed circuit board and the transparent plate; the shape of the pins is designed so that the base can be raised above the printed circuit board, such that components may be installed under the base, optimizing the size; the weight of the single part is low, particularly when the slanting part contains a central recess, so that the detection surface can be placed in contact with the transparent plate without exerting an excessive force on this plate and on the printed circuit board.

What is claimed is:

1. A key device with capacitive effect to detect a presence of an element on an upper surface of a plate, the key device comprising:

a key supported by a printed circuit board approximately parallel to the plate and electrically connected to an electronic detection circuit supported by the printed circuit board, wherein the key is an electrically conductive spring blade having a base connected to the printed circuit board, an approximately planar upper part which forms a detection surface in direct elastic contact with a lower surface of the plate, and a central part which connects the base and the approximately planar upper part.

2. The key device according to claim 1, characterized in that the electrically conducting spring blade is Z-shaped, the base is approximately planar, the base and the approximately planar upper part form the two ends of a Z, and the central part forms the slanting part of the Z.

3. The key device according to claim 2, characterized in that the central part has a central recess along an entire length of the central part.

4. The key device according to claim 1, characterized in that the electrically conductive spring blade further has pins which extend approximately perpendicular from the base into a plurality of holes in the printed circuit board, to connect the base to the printed circuit board, and electrically link the detection surface and the electronic detection circuit.

5. The key device according to claim 4, characterized in that the pins contain a shoulder which contacts the printed circuit board and maintains a spacing between the base and the printed circuit board.

6. The key device according to claim 4, characterized in that there are three pins.

7. The key device according to claim 6, characterized in that the first two pins extend from a free end of the base and the third pin extends from the end opposite another free end.

8. The key device according to claim 1, characterized in that the electrically conductive spring blade contains copper.

\* \* \* \* \*